United States Patent
Nakai et al.

(10) Patent No.: US 8,961,685 B2
(45) Date of Patent: Feb. 24, 2015

(54) METHOD OF MANUFACTURING SILICON SINGLE CRYSTAL, SILICON SINGLE CRYSTAL, AND WAFER

(75) Inventors: Katsuhiko Nakai, Yamaguchi (JP); Masamichi Ohkubo, Burghausen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 13/977,495

(22) PCT Filed: Nov. 10, 2011

(86) PCT No.: PCT/EP2011/069808
§ 371 (c)(1),
(2), (4) Date: Jun. 28, 2013

(87) PCT Pub. No.: WO2012/089392
PCT Pub. Date: Jul. 5, 2012

(65) Prior Publication Data
US 2013/0277809 A1    Oct. 24, 2013

(30) Foreign Application Priority Data

Dec. 28, 2010  (JP) ................................ 2010-293594
Jun. 8, 2011   (JP) ................................ 2011-128562

(51) Int. Cl.
  *C30B 15/14*    (2006.01)
  *B32B 3/02*     (2006.01)
  *H01L 21/20*    (2006.01)
  *H01L 21/36*    (2006.01)
  *H01L 33/00*    (2010.01)
  (Continued)

(52) U.S. Cl.
  CPC ............... *H01L 29/04* (2013.01); *C30B 15/00* (2013.01); *C30B 29/06* (2013.01); *C30B 33/02* (2013.01); *H01L 21/02532* (2013.01)
  USPC .............. 117/3; 428/64.1; 438/502; 257/627; 257/E21.115

(58) Field of Classification Search
  USPC .................... 257/13, 627, 607, 617, E29.003, 257/E21.115, E29.107, E21.328; 438/473, 438/502
  See application file for complete search history.

(56) References Cited

U.S. PATENT DOCUMENTS 3,141,848 A * 7/1964 Enk et al. ................. 252/62.3 E
6,120,598 A * 9/2000 Iida et al. ........................ 117/13
(Continued)

FOREIGN PATENT DOCUMENTS

EP    2199435 A1    6/2010
FR    1294425       4/1962
(Continued)

OTHER PUBLICATIONS

De Kock A. Jr. et al., "Formation and Elimination of Growth Striations in Dislocation-Free Silicon Crystals", Journal of Crystal Growth, Elsevier, Amsterdam, NL. vol. 28, No. 1, Jan. 1, 1975, pp. 125-137, XP026811711. 0022-0248.

*Primary Examiner* — Evan Pert
*Assistant Examiner* — Gustavo Ramallo
(74) *Attorney, Agent, or Firm* — Brooks Kushman P.C.

(57) ABSTRACT

P-type silicon single crystals from which wafers having high resistivity, good radial uniformity of resistivity and less variation in resistivity can be obtained, are manufactured by the Czochralski method from an initial silicon melt in which boron and phosphorus are present, the boron concentration is not higher than $4E14$ atoms/cm$^3$ and the ratio of the phosphorus concentration to the boron concentration is not lower than 0.42 and not higher than 0.50.

9 Claims, 5 Drawing Sheets

(51) Int. Cl.
*H01L 29/04* (2006.01)
*C30B 15/00* (2006.01)
*C30B 29/06* (2006.01)
*C30B 33/02* (2006.01)
*H01L 21/02* (2006.01)

(56) References Cited

U.S. PATENT DOCUMENTS

| | | | | |
|---|---|---|---|---|
| 6,162,708 A * | 12/2000 | Tamatsuka et al. | ............ | 438/503 |
| 7,071,080 B2 * | 7/2006 | Falster et al. | ................. | 438/473 |
| 7,651,566 B2 * | 1/2010 | Kirscht et al. | .................. | 117/13 |
| 2004/0192015 A1 * | 9/2004 | Ammon et al. | ............... | 438/502 |
| 2007/0181868 A1 * | 8/2007 | Fujiwara et al. | ................. | 257/13 |
| 2008/0286565 A1 * | 11/2008 | Koike et al. | .................... | 428/332 |
| 2010/0155903 A1 * | 6/2010 | Ishisaka et al. | ................ | 257/617 |
| 2013/0161793 A1 * | 6/2013 | Nakai et al. | ................... | 257/607 |

FOREIGN PATENT DOCUMENTS

| | | |
|---|---|---|
| JP | 3931956 B2 | 3/2007 |
| JP | 2007314374 A | 12/2007 |
| JP | 2008308383 A | 12/2008 |
| JP | 2009221079 A | 10/2009 |
| WO | 2009003183 A1 | 12/2008 |
| WO | 2009025337 A1 | 2/2009 |
| WO | 2009025341 A1 | 2/2009 |
| WO | 2009151077 A1 | 12/2009 |

* cited by examiner

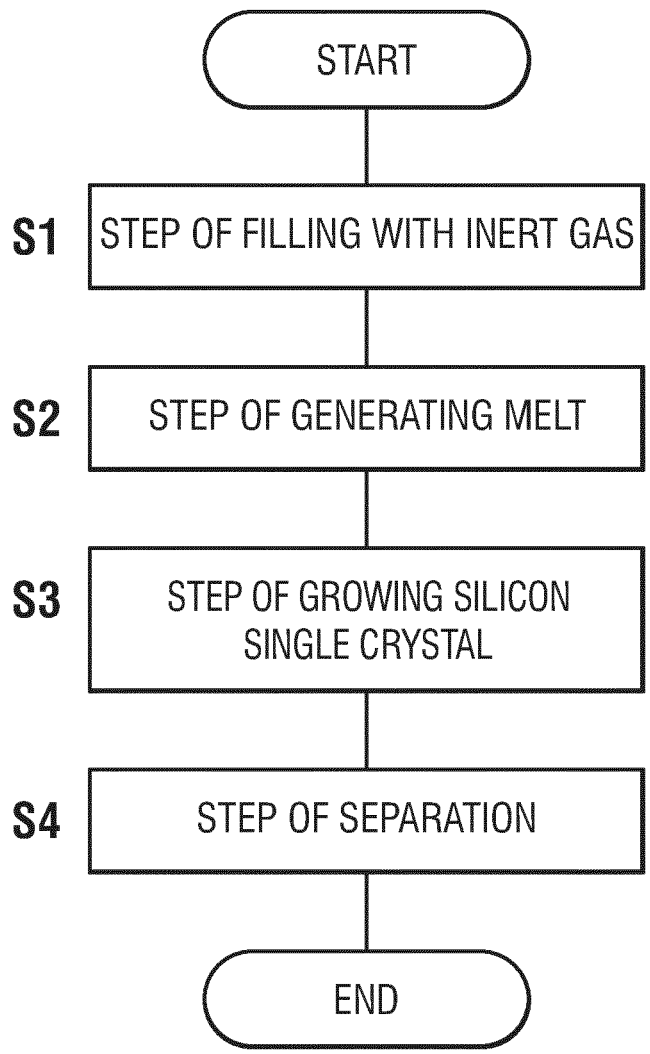

METHOD OF MANUFACTURING SILICON SINGLE CRYSTAL, SILICON SINGLE CRYSTAL, AND WAFER

CROSS-REFERENCE TO RELATED APPLICATIONS

This application is the U.S. National Phase of PCT Application No. PCT/EP2011/069808 filed Nov. 10, 2011, which claims priority to Japanese Patent Application No. 2010-293594 filed Dec. 28, 2010 and Japanese Patent Application No. 2011-128562 filed Jun. 8, 2011, the disclosures of which are incorporated in their entirety by reference herein.

BACKGROUND OF THE INVENTION

1. Field of the Invention

The present invention relates to a method of manufacturing a silicon single crystal, a silicon single crystal, and a wafer, and particularly to a method of manufacturing a silicon single crystal by the Czochralski method, a silicon single crystal, and a wafer.

2. Description of the Related Art

Power devices in cars, home appliances or the like should have a high breakdown voltage, and the resistance of the power device substrate affects the characteristics thereof. Therefore, a silicon wafer used as the substrate is required to be high in resistivity with a low variation of resistance.

When a p-type silicon single crystal is grown by the Czochralski method with boron being added as an impurity (dopant), boron is condensed in the silicon melt during growth of single crystal, because the segregation coefficient of boron with respect to the silicon single crystal is less than 1. Thus, the boron concentration in silicon single crystal increases with growth of the single crystal. Consequently, the resistivity of the silicon single crystal is varied at the tip and tail ends of a central axis during crystal growth (hereinafter referred to as a "central axis during crystal growth") of the silicon single crystal (ingot).

As a conventional technique for suppressing such variation in axial resistivity due to segregation, a technique for suppressing axial variation in resistivity by adding phosphorus in an amount corresponding to 25 to 30% of the boron concentration to the initial silicon melt, and then growing the crystal by the Czochralski method is available. Japanese Patent No. 3931956 refers to this conventional technique.

The conventional technique described above, however, cannot realize the stricter radial uniformity of resistivity and stricter variation in resistivity among wafers, that are required in a silicon single crystal wafer for power device applications.

SUMMARY OF THE INVENTION

It is an object of the present invention to provide a method for increasing the radial and axial resistivity uniformities. These and other objects are surprisingly and unexpectedly attained by a method of manufacturing a silicon single crystal, characterized in that p-type silicon single crystal is grown by a Czochralski method from an initial silicon melt in which the boron concentration is not higher than $4E14$ atoms/cm$^3$ and the ratio of the phosphorus concentration to the boron concentration is not lower than 0.42 and not higher than 0.50. By this method, a p-type silicon single crystal, from which a wafer having high resistivity, good radial uniformity of resistivity and less variation in resistivity can be obtained.

BRIEF DESCRIPTION OF THE DRAWINGS

FIG. 2 is a flowchart for performing the method of manufacturing a silicon single crystal according to one embodiment of the present invention.

DETAILED DESCRIPTION OF THE PREFERRED EMBODIMENTS

A method for manufacturing a silicon single crystal, a silicon single crystal, and a wafer according to one embodiment of the present invention will be described hereinafter in detail with reference to the drawings.

The method of manufacturing silicon single crystal according to the present embodiment relates to manufacturing of a wafer for a power device. A wafer employed for forming a power device should satisfy such specifications as having a resistivity not lower than 50 Ω·cm, a variation in resistivity among wafers not higher than 10%, and a radial variation in wafer resistivity not higher than 3%, mainly for the following reasons.

First, since a high voltage is applied to a power device, the power device should have a high breakdown voltage. In addition, a breakdown voltage of a power device correlates with the resistivity of a wafer from which the power device is formed. Therefore, a wafer employed for a power device should have a high resistivity. Currently prevailing power devices have a breakdown voltage not lower than 250 V, and the wafers are required to have a resistivity not lower than 50 Ωcm. On the other hand, as the resistivity of a wafer becomes higher, the width of the depletion layer becomes greater. A width of a depletion layer which is excessively larger than the device structure will lead to contact of the depletion layer with a portion other than the pn junction, resulting in lowering of the breakdown voltage characteristics. From the foregoing, in order to increase the breakdown voltage of a power device, the resistivity of the wafer should be higher and at the same time, variation thereof should be less.

Secondly, in a power device, a transistor in which a collector current is extracted from the back surface of a silicon substrate (for example, an IGBT (Insulated Gate Bipolar Transistor)) is provided, and the influence of variation in the resistivity in the wafer on transistor characteristics is relatively large. Therefore, a wafer for forming such a transistor should be a wafer having a high resistivity and less variation of resistivity such that characteristics of the transistor are within the specifications.

Thirdly, radial variations in resistivity in the wafers lead to a low yield in screening after device formation, because the device manufacturer cannot screen wafers at the time of accepting the same. Therefore, in order to suppress increases in cost due to a lower yield of devices, the wafers to be used for device fabrication should have less variation in resistivity.

Figure 1:
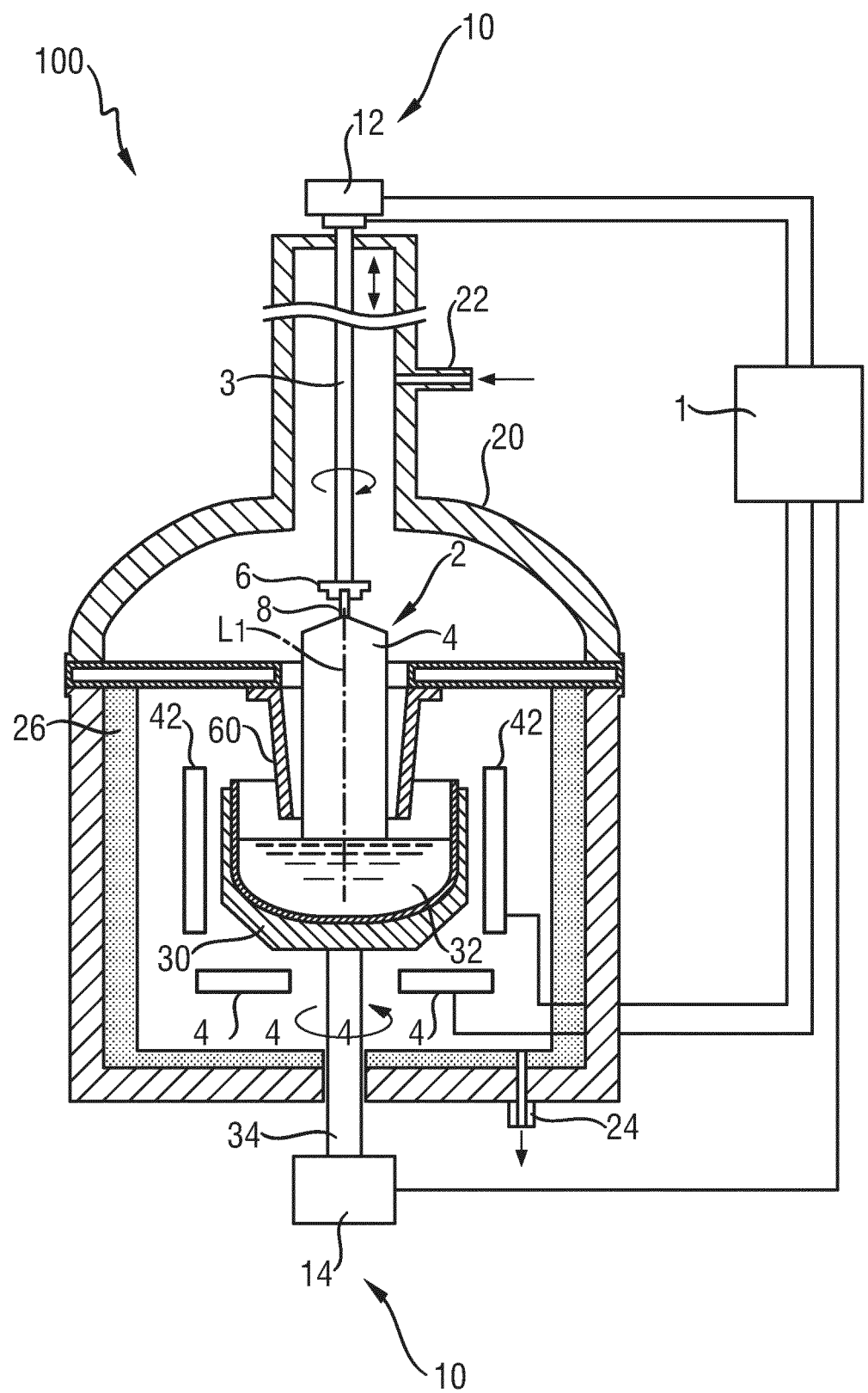
FIG. 1 is a schematic diagram of a silicon single crystal manufacturing apparatus for manufacturing a silicon single crystal according to an embodiment of the present invention.

FIG. 1 is a schematic diagram of a silicon single crystal manufacturing apparatus for performing a method of manufacturing a silicon single crystal according to the present invention.

As shown in FIG. 1, a silicon single crystal manufacturing apparatus 100 is an apparatus for manufacturing a silicon single crystal by the Czochralski method (hereinafter referred to as a "CZ method"). Silicon single crystal manufacturing apparatus 100 has a crucible 30 accommodating a silicon melt and a drive device 10 for raising and lowering the silicon single crystal 2, rotating the silicon single crystal 2, and rotating the crucible 30. Silicon single crystal manufacturing apparatus 100 has a control device 1 for controlling the raising and lowering of the silicon single crystal 2, the rotation of the silicon single crystal 2, and the rotation of crucible 30 by drive device 10.

Silicon single crystal manufacturing apparatus 100 has a chamber 20 accommodating crucible 30 and silicon single crystal 2, a heater 42 arranged along a sidewall of crucible 30, a heater 44 arranged under crucible 30, and a heat insulator 26 arranged along a sidewall and a bottom of chamber 20.

Silicon single crystal manufacturing apparatus 100 has a wire 3 suspended from an upper portion of chamber 20 and a chuck 6 provided at a tip end of wire 3, for holding seed crystal 8.

Silicon single crystal manufacturing apparatus 100 has a gas introduction port 22 for introducing an inert gas into chamber 20, a gas exhaust port 24 for exhausting the introduced inert gas out of chamber 20, and a flow regulation tube 60 for regulating flow of the inert gas. An Ar gas is exemplified as an inert gas.

A silicon melt 32 is provided from polycrystalline silicon as a source material.

In the present invention, in order to manufacture p-type silicon single crystal 2, boron (B) is added as a p-type impurity (acceptor) to silicon melt 32 from which the single crystal initially grows (hereinafter referred to as an "initial silicon melt"). In addition, phosphorus (P), which is an n-type impurity (donor) and lower than boron in segregation coefficient with respect to silicon single crystal 2, is further added. Thus, the reason why phosphorus which is an impurity opposite to boron in conductivity type and lower than boron in segregation coefficient with respect to silicon single crystal 2 is added to the initial silicon melt is to increase resistivity of silicon single crystal 2 and to prevent variation in resistivity in a direction of the central axis during crystal growing (increase in the rate of change in resistivity).

In addition, in the present invention, variation in resistivity in the direction of the central axis during crystal growing is further suppressed in order to further suppress radial variation in resistivity (increase in the rate of change in resistivity) in a plane perpendicular to the central axis during growth of the silicon single crystal 2. To that end, the initial silicon melt is made to satisfy the requirement that the boron concentration is not higher than 4E14 atoms/cm$^3$ and the ratio of the phosphorus concentration to the boron concentration is not lower than 0.42 and not higher than 0.50, details of which will be described later.

Crucible 30 is formed, for example, of synthetic quartz glass. Crucible 30 is connected at its bottom to a shaft 34 supporting the crucible. Flow regulation tube 60 is provided above crucible 30 and it is substantially in the shape of a frustum.

Drive device 10 comprises a winding machine 12 for pulling out and winding up wire 3 and a crucible driver 14 for rotating crucible 30. Winding machine 12 can wind up wire 3 as it turns. Shaft 34 is connected to crucible driver 14 and crucible 30 is rotated by crucible driver 14 with shaft 34 being interposed.

Control device 1 is electrically connected to winding machine 12, heaters 42 and 44, and crucible driver 14. Control device 1 can control a speed of wind-up of wire 3 by winding machine 12, a direction of rotation of wire 3, a speed of rotation of wire 3. Thus, controlled are the speed of crystal growth of the silicon single crystal 2, the direction of rotation of the silicon single crystal 2, and the speed of rotation of the silicon single crystal 2. Control device 1 can control the direction and speed of rotation of crucible 30 by crucible driver 14. Control device 1 can control the output of heaters 42 and 44 and can control the temperature of silicon melt 32 by fixing the output of heater 44 and varying the output of heater 42.

Control device 1 is mainly configured with a CPU (Central Processing Unit) and a storage device, and it causes the storage device to store an operation of the entire silicon single crystal manufacturing apparatus 100. Control device 1 can be configured, for example, with a PC (Personal Computer) or an EWS (Engineering Work-Station). The method of manufacturing silicon single crystal according to the present invention can be performed as control device 1 controls an operation of each component.

FIG. 2 is a flowchart for performing the method of manufacturing silicon single crystal according to the present invention.

The method of manufacturing silicon single crystal according to the present invention is a method for manufacturing a silicon single crystal 2 by the CZ method, and it comprises an inert gas filling step S1 to establish an inert gas atmosphere in chamber 20, a melt generation step S2 for generating silicon melt 32, a silicon single crystal growth step S3 for growing a silicon single crystal 2, and a separation step S4 for separating the silicon single crystal 2 from silicon melt 32.

In the inert gas filling step S1, chamber 20 is sealed and chamber 20 is provided with an inert gas atmosphere by introducing an inert gas through gas introduction port 22 while gas is evacuated from the chamber through gas exhaust port 24 by means of a vacuum pump (not shown). It is noted that chamber 20 is maintained in the inert gas atmosphere by feeding the inert gas into chamber 20 also during each step which will be described below.

In melt generation step S2 after inert gas filling step S1, the source material supplied into crucible 30 is melted by heaters 42 and 44, to thereby generate an initial silicon melt 32.

In the present invention, boron and phosphorus are added to silicon melt 32, so that the initial silicon melt 32 satisfies the requirements that the boron concentration is not higher than 4E14 atoms/cm$^3$ and the ratio of the phosphorus concentration to the boron concentration is not lower than 0.42 and not higher than 0.50.

When the initial silicon melt 32 has such a composition, resistivity of the silicon single crystal 2 can be increased, the rate of change in resistivity along a central axis during crystal growing L1 can further be lowered, and the rate of change in resistivity in a cross-section perpendicular to the central axis during crystal growing L1 can be lowered. Namely, a p-type silicon single crystal 2, in which the resistivity along the central axis during crystal growing L1 is not lower than 50 Ω·cm, the rate of change in resistivity along the central axis during crystal growing L1 is not higher than 10%, and the rate of change in resistivity in a cross-section perpendicular to the central axis during crystal growing L1 is not higher than 3%, can be grown.

Here, the rate of change in resistivity is defined by Equation (1) below.

Rate of Change in Resistivity=(Maximum Value of Resistivity−Minimum Value of Resistivity)/ Maximum Value of Resistivity    Equation (1)

In silicon single crystal growth step S3 after melt generation step S2, seed crystal 8 is moved down to a surface of the silicon melt 32 by means of winding machine 12 and it is immersed therein. Then, silicon single crystal 2 is grown from silicon melt 32 by means of winding machine 12, to thereby grow a straight part of ingot 4 of silicon single crystal 2. Silicon single crystal 2 and crucible 30 rotate in a direction opposite to each other.

In the present invention, the speed of growing the silicon single crystal 2 in silicon single crystal growth step S3 is not lower than 0.9 mm/min and the rate of cooling of the crystal edge portion can be at least 1.4 times as high as a rate of cooling of a crystal central portion. Here, the rate of cooling refers to a value calculated by multiplying an average temperature gradient (° C./mm) in a direction of an axis of crystal growth from the melting point to 1350° C., which is an average in a range from the melting point to 1350° C. during crystal growth, by a rate of crystal growing (mm/min). A rate of crystal growth lower than 0.9 mm/min is not preferred because of poor productivity. A rate of cooling of the crystal edge portion less than 1.4 times as high as the rate of cooling of a crystal central portion leads to poor efficiency in cooling the silicon single crystal, and thus the rate of crystal growth becomes lower than 0.9 mm/min and productivity becomes poor. The upper limit of a rate of crystal growth is 1.9 mm/min in consideration of the capability of a silicon single crystal growing apparatus that can be realized, and the upper limit of the rate of cooling of the crystal edge portion is twice as high as the rate of cooling of the crystal central portion.

The straight part of ingot 4 is a cylindrical portion of silicon single crystal 2, for which the diameter is substantially constant in a direction of the central axis during crystal growth L1 of the silicon single crystal 2. Once the silicon single crystal 2 reaches a predetermined diameter after a conical portion is formed, the straight part of ingot 4 is grown.

In separation step S4 after the straight part of ingot 4 is grown, wind-up of wire 3 is stopped and the silicon single crystal 2 is separated from the silicon melt 32 by moving crucible 30 downwards.

According to the present invention, p-type silicon single crystal 2, in which the resistivity along the central axis during crystal growing L1 is not lower than 50 Ω·cm, a rate of change in resistivity along the central axis during crystal growing L1 is not higher than 10%, and the rate of change in resistivity in the cross-section perpendicular to the central axis during crystal growing L1 is not higher than 3%, can be manufactured.

The reason why the present invention achieves such an effect will be described below.

Figure 3A:
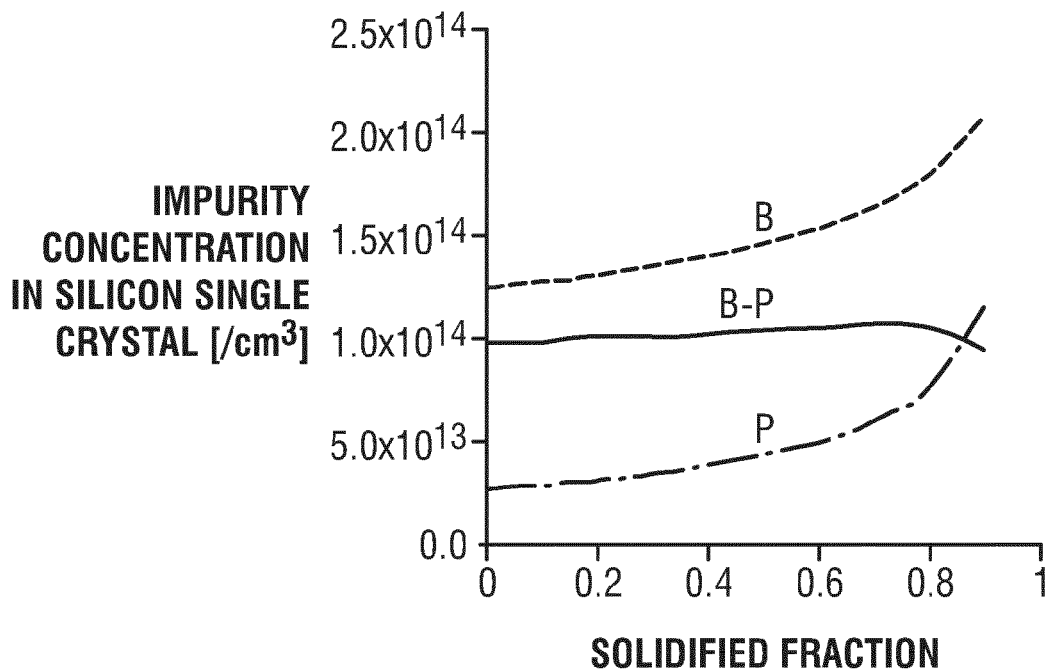
FIGS. 3a & 3b are diagrams showing a result of a simulation of the relationship between a solidified fraction of a silicon single crystal and an impurity concentration in silicon single crystal, as well as a result of measurement and a result of simulation of relation between a solidified fraction and resistivity of silicon single crystal.
Figure 3B:
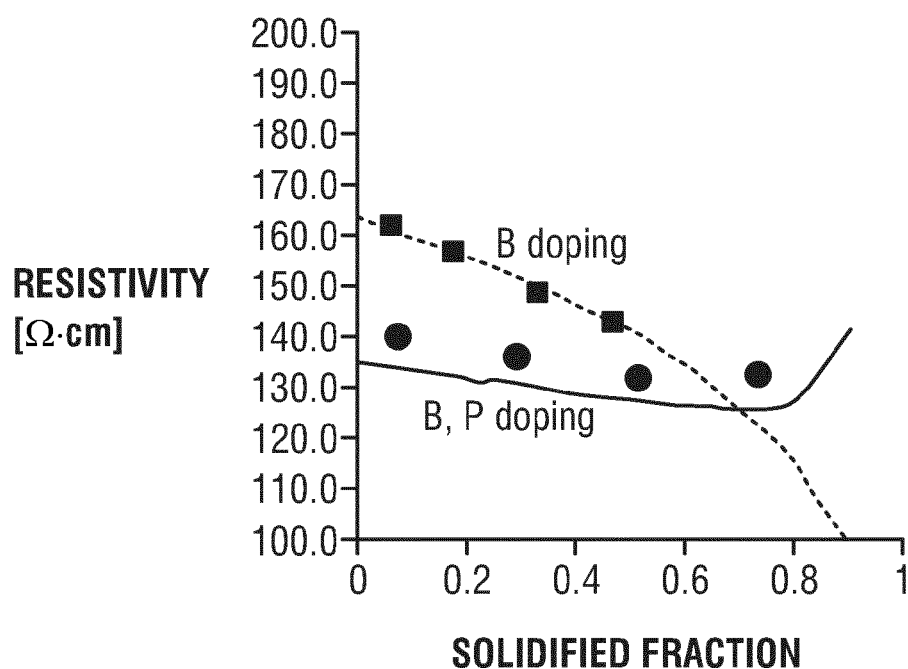

FIG. 3A is a diagram showing a result of a simulation of relationship between a solidified fraction of the silicon single crystal and the impurity concentration in the silicon single crystal. FIG. 3B is a diagram showing a result of measurement and a result of simulation of the relationship between a solidified fraction and the resistivity of silicon single crystal. A dotted line in FIG. 3B shows the result of actual measurement, while a solid line shows the result of simulation.

As shown in FIG. 3A, in the case where boron alone is added to the initial silicon melt, as the silicon single crystal grows (that is, the solidified fraction becomes higher), the impurity concentration in the silicon single crystal increases exponentially. Consequently, as shown in FIG. 3B, as the silicon single crystal grows, the resistivity of the silicon single crystal drops.

This is because a segregation coefficient k of boron with respect to silicon single crystal is around 0.78, which is less than 1, and therefore, as the silicon single crystal grows, the concentration of boron in the silicon melt increases and the ratio of boron taken into silicon single crystal becomes higher.

In the case where phosphorus alone is added to the initial silicon melt as well, similarly, as the silicon single crystal grows, the impurity concentration in the silicon single crystal increases exponentially. On the other hand, the segregation coefficient k of phosphorus with respect to the silicon single crystal is around 0.38, which is lower than the segregation coefficient of boron. Therefore, the rate (speed) of increase in the concentration of phosphorus in the silicon melt during growth of the silicon single crystal is higher than in the case of boron. Thus, the rate of decrease in resistivity during growth of silicon single crystal is also higher than in the case where boron is added.

Since boron is a p-type impurity, addition of boron to a silicon single crystal produces holes as p-type carriers in the silicon single crystal. Since phosphorus is an n-type impurity, addition of phosphorus to a silicon single crystal produces electrons as n-type carriers in the silicon single crystal.

In a silicon single crystal to which both boron and phosphorus are added, carriers of opposite type in conductivity cancel each other. Therefore, by adding phosphorus together with boron to a silicon single crystal in manufacturing a p-type semiconductor, the p-type carrier density in the silicon single crystal can be lowered and the resistivity can be increased.

In addition, the rate of increase in impurity concentration during growth of silicon single crystal is greater in the case of the addition of phosphorus than in the case of the addition of boron. Therefore, by canceling the increase in p-type carrier density by increasing boron concentration during growth of the silicon single crystal by increasing n-type carrier density by increasing phosphorus concentration, decrease of resistivity during growth of the silicon single crystal can be prevented. Namely, by setting a ratio of phosphorus concentration to boron concentration in the initial silicon melt (hereinafter referred to as a "P/B ratio") to an appropriate value, decrease in resistivity during growth of the silicon single crystal can be prevented. Since the concentration of boron and phosphorus added to the initial silicon melt is sufficiently low, boron and phosphorus are considered to be independently segregated with respect to the silicon single crystal.

Specifically, as shown in FIG. 3A, by selecting a P/B ratio of the initial silicon melt such that the difference between the boron concentration and the phosphorus concentration in the silicon single crystal in growing the silicon single crystal is constant, a value of resistivity during growth of the silicon single crystal can be maintained constant, as shown in FIG. 3B.

FIG. 3B shows a result of measurement and a result of simulation of resistivity in a case where an initial silicon melt has a boron concentration of $1.6E14$ atoms/cm$^3$ and a P/B ratio of 0.45.

Figure 4:
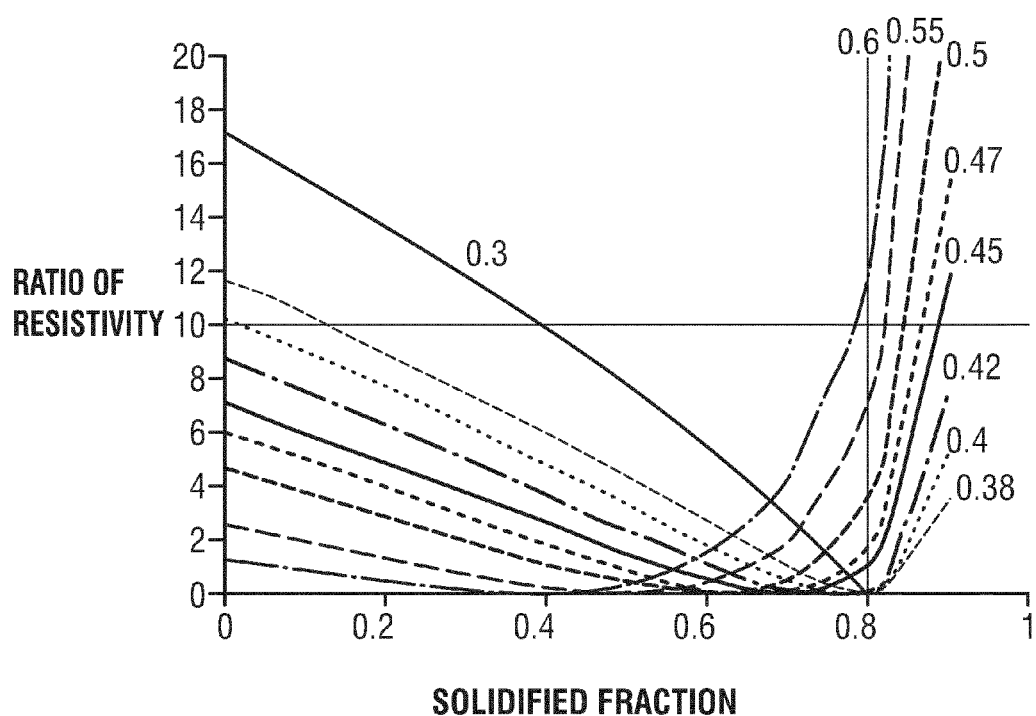
FIG. 4 is a diagram showing a result of a simulation of the dependency of the relationship between a solidified fraction and resistivity of silicon single crystal on an initial silicon melt P/B ratio.

FIG. 4 is a diagram showing a result of simulation of dependency of the relationship between a solidified fraction and resistivity of silicon single crystal on an initial silicon melt P/B ratio. Here, a ratio of resistivity in FIG. 4 is shown in the following Equation (2).

Ratio of Resistivity=(Resistivity at Certain Solidified Fraction−Minimum Value of Resistivity of That Crystal)/Maximum Value of Resistivity of That Crystal     Equation (2)

According to the simulation result shown in FIG. 4, it can be seen that, when the solidified fraction is restricted to 0 to 0.80, the rate of change in resistivity along the central axis during crystal growing can be lowered to 10% or less, by setting the P/B ratio of the initial silicon melt to 0.42 to 0.55. As will be described later, however, in order to lower the rate of change in resistivity in a cross-section perpendicular to the central axis during crystal growth, the P/B ratio should be set to 0.42 to 0.50. The reason why the solidified fraction is restricted to 0 to 0.80 will also be described later.

Here, when the initial silicon melt has a P/B of ratio from 0.42 to 0.50, a phenomenon occurs such that the resistivity of the silicon single crystal 2 starts to increase around a solidified fraction of 0.7 as the silicon single crystal 2 grows (hereinafter, a point where the resistivity starts to increase being referred to as a "flexion point"). This phenomenon indicates that p-type carriers (holes) in silicon single crystal 2 start to decrease, which is caused by the fact that the rate of incorporation of phosphorus in the silicon single crystal 2 exceeds the rate of incorporation of boron.

In the present invention, the rate of change in resistivity along the central axis during crystal growth is lowered by going so far as to produce a flexion point. Silicon single crystal grown after the flexion point also maintains the p conductivity type so long as the phosphorus concentration in the silicon single crystal does not exceed the boron concentration, and no problem arises in using the silicon single crystal for a wafer for a power device.

By thus further lowering the rate of change in resistivity along the central axis during crystal growth, the rate of change in resistivity in the cross-section perpendicular to the central axis during crystal growth can further be lowered. The reason therefor will be described below.

Figure 5A:
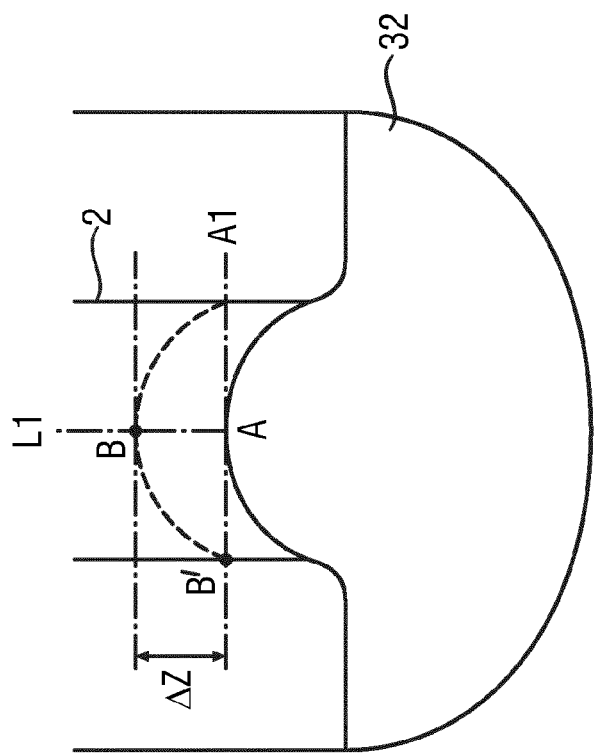
FIG. 5 is an illustrative view showing a silicon solid-liquid interface during growth of a silicon single crystal by a Czochralski method and the relation between a position on a central axis during crystal growing and resistivity.
Figure 5B:
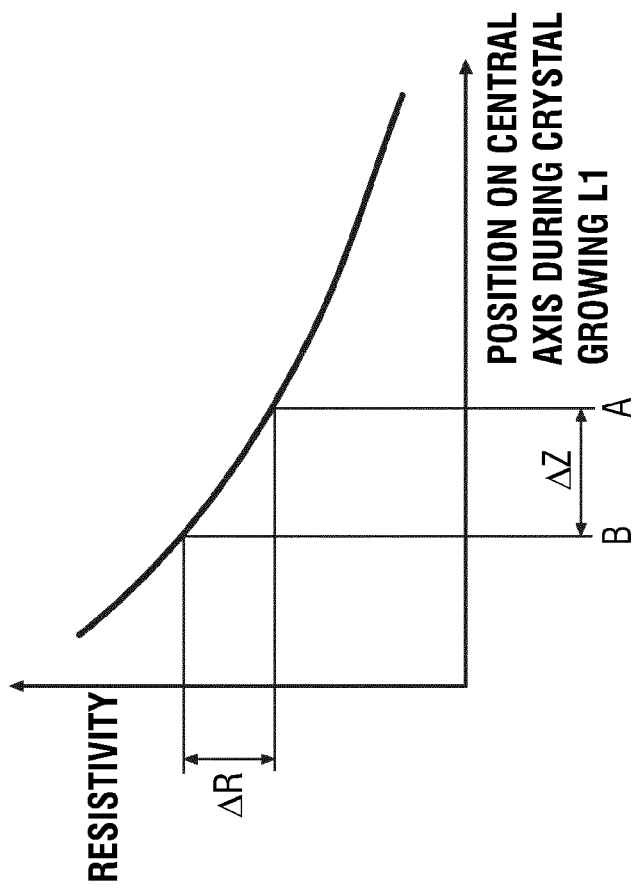

FIG. 5 is an illustrative view showing a silicon solid-liquid interface (a boundary surface between the silicon melt and the silicon single crystal) at the time of growing the silicon single crystal by the CZ method.

As shown in FIG. 5, a silicon solid-liquid interface at the time of growing the silicon single crystal 2 has a shape protruding in the direction of the central axis. A point A indicates an intersection between a current solid-liquid interface and the central axis during crystal growth L1. A point B' indicates an intersection between a horizontal cross-section (cross-section perpendicular to the central axis during crystal growing) of the silicon single crystal including point A and a side surface of silicon single crystal 2. A point B indicates an intersection between the past solid-liquid interface and the central axis during crystal growing L1. A distance between A and B is denoted as ΔZ and the difference in resistivity between A and B is denoted as ΔR.

Here, since each resistivity on solid-liquid interface is constant, resistivity is the same at point B and point B'. On the other hand, the change in resistivity between point A and point B corresponds to a rate of change in resistivity along central axis during crystal growth L1, while the change in resistivity between point A and point B' corresponds to a rate of change in resistivity in a cross-section A1 perpendicular to central axis during crystal growing L1. Therefore, in order to lower the rate of change in resistivity in cross-section A1 perpendicular to central axis during crystal growth L1, inclination of resistivity ΔR/ΔZ in the direction of central axis during crystal growing L1 should be decreased. Based on the simulation in FIG. 4, in order to decrease the inclination of resistivity, it is effective to set the upper limit of the solidified fraction and to set a P/B ratio within a certain range. A region where the solidified fraction exceeds 0.80 has great inclination of resistivity at any P/B ratio, and therefore a rate of change in resistivity in a cross-section perpendicular to the central axis during crystal growing L1 exceeds 3%. When the solidified fraction is restricted to 0 to 0.80, by setting the P/B ratio in the initial silicon melt between 0.42 or higher and 0.50 or lower, a rate of change in resistivity in the cross-section perpendicular to the central axis during crystal growing L1 is 3% or lower, as demonstrated in the examples which will be described later. More preferably, by setting the P/B ratio between 0.42 or higher and 0.47 or lower in a case where the solidified fraction is restricted to 0 to 0.80, the rate of change in resistivity in the cross-section perpendicular to the central axis during crystal growing is 2% or lower as demonstrated in the examples which will be described later. In a case where the solidified fraction is restricted to 0 to 0.80, by setting the P/B ratio between more than 0.50 and 0.55 or lower, inclination of resistivity on a crystal bottom side becomes great and hence a rate of change in resistivity in the cross-section perpendicular to central axis during crystal growing L1 exceeds 3%. By restricting the solidified fraction to less than 0.80, a rate of change in resistivity in the cross-section perpendicular to central axis during crystal growing L1 can be not higher than 3% even though the P/B ratio is higher than 0.50 and not higher than 0.55. Restriction of the solidified fraction to less than 0.80, however, is not preferred because of poor productivity.

In order to lower the rate of change in resistivity in a cross-section perpendicular to the central axis during crystal growing, it is also effective to control conditions for cooling the silicon single crystal during crystal growth so as to achieve a flat shape of the solid-liquid interface, that is, to decrease ΔZ in FIG. 5. In this case, however, a rate of cooling of the crystal edge portion should be less than 1.4 times, preferably 1.0 times, as high as the rate of cooling of the crystal central portion. As described previously, lowering the rate of cooling of the edge portion leads to poorer efficiency in cooling the silicon single crystal. As a result, the of crystal growth becomes less than 0.9 mm/min and productivity becomes poor. The present invention can achieve less variation in resistivity without lowering productivity in silicon single crystal growing.

By controlling the rate of cooling of the crystal edge portion and the rate of cooling of the crystal central portion so as to set a value for ΔZ in a range of from 5 to 15 mm, the rate of change in resistivity in a cross-section perpendicular to the central axis during crystal growth L1 can be not higher than 3%, while productivity is maintained. By setting a ratio of the rate of cooling of the crystal edge portion to the rate of cooling of the crystal central portion between 1.4 or higher and 2.0 or lower, a value for ΔZ can be controlled in a range from 5 to 15 mm.

According to the present invention, a rate of change in resistivity in a cross-section perpendicular to the central axis of crystal growing can be lowered without using such special facilities as MCZ (Magnetic field applied CZochralski) in which the crystal is grown while a magnetic field is applied. Therefore, manufacturing costs can be suppressed.

Actual measurement of the rate of change in resistivity in cross-section A1 perpendicular to central axis during crystal growing L1 of silicon single crystal 2 was achieved in the Examples which will be described below.

It is noted that a wafer cut from a silicon single crystal obtained in the present invention may be used as it is as a wafer for a power device, or a wafer that has been subjected to high-temperature heat treatment which will be described later may be used.

High-temperature heat treatment is desirably performed in a non-oxidizing atmosphere, because voids or other grown-in defects are not sufficiently eliminated during annealing in an oxidizing atmosphere. The non-oxidizing atmosphere refers to an atmosphere not containing an oxidizing gas such as oxygen, and it includes an inert atmosphere and a reducing atmosphere. The inert atmosphere refers to an atmosphere filled, for example, with such an inert gas as argon, helium, neon, nitrogen, or the like. A reducing atmosphere refers to an atmosphere where such a reducing gas as hydrogen, carbon monoxide, ammonia, or the like is present.

A temperature for heat treatment of a wafer is in a range of from 1150 to 1250° C., preferably from 1175 to 1215° C., and more preferably from 1185 to 1200° C.

If the temperature for heat treatment of a silicon substrate is lower than 1150° C., voids or other grown-in defects are not sufficiently eliminated during annealing. Alternatively, if the temperature exceeds 1250° C., furnace members deteriorate significantly.

A time period for heat treatment of a wafer is not shorter than 10 minutes and not longer than 2 hours, preferably not shorter than 30 minutes and not longer than 1.5 hours, and more preferably not shorter than 50 minutes and not longer than 1 hour.

If the time period for heat treatment of a wafer is shorter than 10 minutes, voids or other grown-in defects are not sufficiently eliminated during annealing. Alternatively, if the time period exceeds 2 hours, productivity becomes poor, which is not preferred.

A commercially available heat treatment furnace (or a reaction chamber) for performing heat treatment (annealing) in the manufacturing method according to the present invention may be employed, and the furnace is not particularly restricted. It is noted that it is necessary to avoid growth of an oxide film to 2 nm or greater during heat treatment, because attachment of an oxide film to the surface prevents shrinkage and elimination of defects during annealing. Specifically, such measures as decreasing as much as possible an amount of impurity introduced in an atmospheric gas during heat treatment or decreasing as much as possible intake of air from surroundings in inserting a silicon wafer into a furnace are necessary. For example, a noble gas such as argon, in which impurity is suppressed to 5 ppma or lower, is preferred as an atmospheric gas to be used.

A member holding a silicon wafer used in the manufacturing method according to the present invention is not particularly restricted, and for example, quartz or the like is employed. These members significantly deteriorate when a temperature for annealing drops excessively. Then, frequent exchange is necessitated, which leads to increase in manufacturing cost.

Examples and Comparative Examples of the method of manufacturing silicon single crystals according to the embodiment of the present invention will now be described. Manufacturing of Silicon Single Crystal An apparatus for manufacturing a silicon single crystal by the CZ method was used to grow silicon single crystal (ingot) having a diameter of 200 mm.

Here, the initial silicon melt had boron and phosphorus concentrations shown below, and a seed crystal was immersed in the initial silicon melt to grow silicon single crystal. The speed of crystal growth was set to 0.9 mm/min, and the rate of cooling of the crystal edge portion was set to 1.9 times as high as the rate of cooling of the crystal central portion.

(1) EXAMPLE 1

Boron and phosphorus were added to the initial silicon melt, such that the boron concentration was 1.6E14 atoms/$cm^3$ and the phosphorus concentration was 7.2E13 atoms/$cm^3$ (the ratio of phosphorus concentration to boron concentration was 0.45).

(2) EXAMPLE 2

Boron and phosphorus were added to the initial silicon melt, such that the boron concentration was 4.0E14 atoms/$cm^3$ and the phosphorus concentration was 1.8E14 atoms/$cm^3$ (the ratio of phosphorus concentration to boron concentration was 0.45).

(3) EXAMPLE 3

Boron and phosphorus were added to the initial silicon melt, such that the boron concentration was 1.1E14 atoms/$cm^3$ and the phosphorus concentration was 4.6E13 atoms/$cm^3$ (the ratio of phosphorus concentration to boron concentration was 0.42).

(4) EXAMPLE 4

Boron and phosphorus were added to the initial silicon melt, such that the boron concentration was 1.6E14 atoms/$cm^3$ and the phosphorus concentration was 7.5E13 atoms/$cm^3$ (the ratio of phosphorus concentration to boron concentration was 0.47).

(5) EXAMPLE 5

Boron and phosphorus were added to the initial silicon melt, such that the boron concentration was 1.6E14 atoms/$cm^3$ and the phosphorus concentration was 8.0E13 atoms/$cm^3$ (the ratio of phosphorus concentration to boron concentration was 0.50).

(6) COMPARATIVE EXAMPLE 1

Boron was added to the initial silicon melt such that boron concentration was 1.0E14 atoms/$cm^3$.

(7) COMPARATIVE EXAMPLE 2

Boron and phosphorus were added to the initial silicon melt, such that the boron concentration was 1.4E14 atoms/$cm^3$ and the phosphorus concentration was 4.2E13 atoms/$cm^3$ (the ratio of phosphorus concentration to boron concentration was 0.30).

(8) COMPARATIVE EXAMPLE 3

Boron and phosphorus were added to the initial silicon melt, such that the boron concentration was 1.8E14 atoms/cm$^3$ and the phosphorus concentration was 9.9E13 atoms/cm$^3$ (the ratio of phosphorus concentration to boron concentration was 0.55).

Evaluation of the Silicon Single Crystals

Grown silicon single crystals were cut perpendicularly to the central growth axis into slices, to thereby form sliced wafers. Thereafter, the sliced wafers were taken from a plurality of positions along the direction of the central axis during crystal growth, and then mirror finished. The wafers were thus fabricated. The wafers were subjected to high-temperature treatment at 1200° C. for 1 hour in an argon gas atmosphere.

Resistivity at each of the center, a point at a radius of 50 mm and a point at a radius of 90 mm of the wafers was measured with a four point probe method.

The result of measurement of resistivity at the central point of each wafer was substituted into Equation (1), to thereby calculate a rate of change in resistivity along the central axis during crystal growing of silicon single crystal.

In addition, the result of measurement of resistivity at each of the center, the point at a radius of 50 mm and the point at a radius of 90 mm of each silicon wafer was substituted into Equation (1), to thereby similarly calculate a radial rate of change in resistivity in a silicon wafer.

(1) EXAMPLE 1

Table 1 shows the results in Example 1.

Table 1 shows resistivity at the wafer center and a radial rate of change in resistivity in wafer with respect to a solidified fraction at a position where the wafer was taken in silicon single crystal manufactured according to Example 1.

TABLE 1

| Solidified Fraction | Resistivity at Wafer Center [Ω · cm] | Radial Rate of Change in Resistivity [%] |
|---|---|---|
| 0.07 | 140 | 1.3 |
| 0.29 | 136 | 0.6 |
| 0.51 | 131 | 0.4 |
| 0.55 | 130 | 1.4 |
| 0.58 | 130 | 1.2 |
| 0.61 | 130 | 0.9 |
| 0.64 | 130 | 1.2 |
| 0.67 | 130 | 0.6 |
| 0.71 | 130 | 0.5 |
| 0.73 | 132 | 1.0 |
| 0.80 | 138 | 0.8 |

According to Table 1, at a site where the solidified fraction was not higher than 0.80, a minimum value of resistivity along the central axis during crystal growth of the silicon single crystal (corresponding to resistivity at the wafer center) was 130 Ω·cm, the rate of change in resistivity along the central axis during crystal growth was 7.1%, and a maximum value of the rate of change in resistivity in the cross-section perpendicular to the central axis during crystal growing was 1.4%.

Thus, in manufacture of a silicon single crystal, in which resistivity along the central axis during crystal growing of silicon single crystal was not lower than 50 Ω·cm, the rate of change in resistivity along the central axis during crystal growth was not higher than 10%, and the rate of change in resistivity in the cross-section perpendicular to the central axis during crystal growth was not higher than 3%, could be realized.

It is noted that the maximum value of the radial rate of change in resistivity at a site where the solidified fraction exceeded 0.80 in the silicon single crystal obtained in the present Example exceeded 3%.

(2) COMPARATIVE EXAMPLE 1

Table 2 shows results in Comparative Example 1.

Table 2 shows results of resistivity at the silicon wafer center and a radial rate of change in resistivity in a silicon wafer with respect to a solidified fraction at a position where the silicon wafer was taken in silicon single crystal manufactured according to Comparative Example 1.

TABLE 2

| Solidified Fraction | Resistivity at Wafer Center [Ω · cm] | Radial Rate of Change in Resistivity [%] |
|---|---|---|
| 0.04 | 162 | 4.0 |
| 0.17 | 156 | 3.5 |
| 0.33 | 148 | 3.7 |
| 0.46 | 143 | 2.0 |
| 0.62 | 131 | 3.2 |
| 0.72 | 122 | 2.8 |
| 0.80 | 114 | 3.4 |

According to Table 2, at a site where the solidified fraction was not higher than 0.80, a minimum value of resistivity along the central axis during crystal growth of the silicon single crystal (corresponding to resistivity at the wafer center) was not lower than 114 Ω·cm, the rate of change in resistivity along the central axis during crystal growth was 29.6%, and a maximum value of the rate of change in resistivity in the cross-section perpendicular to the central axis during crystal growing was 4.0%.

Thus, manufacture of a silicon single crystal, in which resistivity along the central axis during crystal growing of silicon single crystal was not lower than 50 Ω·cm, the rate of change in resistivity along the central axis during crystal growing was not higher than 10%, and the rate of change in resistivity in the cross-section perpendicular to the central axis during crystal growing was not higher than 3%, could not be realized.

(3) COMPARISON AMONG EXAMPLES AND COMPARATIVE EXAMPLES

Table 3 shows results in Examples 1 to 5 and Comparative Examples 1 to 3.

Table 3 shows results of resistivity at the wafer center in the silicon single crystal manufactured according to each Example and each Comparative Example, the rate of change in resistivity along the central axis during crystal growing, and the rate of change in resistivity in the cross-section perpendicular to the central axis during crystal growing, together with each impurity concentration in the initial silicon melt.

TABLE 3

| | Impurity Concentration in Initial Silicon Melt [atoms/cm³] | | | Resistivity at Wafer Center [Ω·cm] | | Rate of Change in Resistivity along Central Axis during Crystal Growing [%] | Rate of Change in Resistivity in Perpendicular Cross-Section [%] |
|---|---|---|---|---|---|---|---|
| | B | P | P/B Ratio | Maximum Value | Minimum Value | | |
| Example 1 | 1.6E+14 | 7.2E+13 | 0.45 | 140 | 130 | 7.1 | 1.4 |
| Example 2 | 4.0E+14 | 1.8E+14 | 0.45 | 54 | 50 | 7.4 | 1.7 |
| Example 3 | 1.1E+14 | 4.6E+13 | 0.42 | 192 | 175 | 8.9 | 1.5 |
| Example 4 | 1.6E+14 | 7.5E+13 | 0.47 | 136 | 128 | 6.1 | 1.6 |
| Example 5 | 1.6E+14 | 8.0E+13 | 0.50 | 139 | 132 | 4.7 | 2.5 |
| Comparative Example 1 | 1.0E+14 | 0 | 0.00 | 163 | 114 | 29.8 | 4.0 |
| Comparative Example 2 | 1.4E+14 | 4.2E+13 | 0.30 | 140 | 117 | 16.9 | 3.4 |
| Comparative Example 3 | 1.8E+14 | 9.9E+13 | 0.55 | 134 | 124 | 7.3 | 3.3 |

According to Table 3, in Examples 1 to 5, at a site where the solidified fraction was not higher than 0.80, a minimum value of resistivity along the central axis during crystal growth ranged from 50 to 175 Ω·cm, the rate of change in resistivity along the central axis during crystal growth ranged from 4.7 to 8.9%, and a maximum value of the rate of change in resistivity in the cross-section perpendicular to the central axis during crystal growth ranged from 1.4 to 2.5%.

Thus, the silicon single crystals obtained in each Example satisfied specifications of a silicon single crystal wafer for a power device where resistivity along the central axis during crystal growth was not lower than 50 Ω·cm, the rate of change in resistivity along the central axis during crystal growing was not higher than 10%, and the rate of change in resistivity in the cross-section perpendicular to the central axis during crystal growing was not higher than 3%.

In addition, in Examples 1 to 4, at a site where the solidified fraction was not higher than 0.80, a maximum value of the rate of change in resistivity in the cross-section perpendicular to the central axis during crystal growing was not higher than 2%.

On the other hand, in Comparative Examples 1 to 3, at a site where the solidified fraction was not higher than 0.80, a minimum value of resistivity along the central axis during crystal growth of the silicon single crystal ranged from 114 to 124 Ω·cm, the rate of change in resistivity along the central axis during crystal growth ranged from 7.3 to 29.8%, and a maximum value of the rate of change in resistivity in the cross-section perpendicular to the central axis during crystal growth ranged from 3.3 to 4.0%.

Thus, the silicon single crystal obtained in the Comparative Examples could not satisfy of specifications for a silicon single crystal wafer for power device applications, with regard to the rate of change in resistivity along the central axis during crystal growth and the rate of change in resistivity in a cross-section perpendicular to the central axis during crystal growth.

Attention being paid to relation between the rate of change in resistivity along the central axis during crystal growth and the radial rate of change in resistivity of silicon single crystals fabricated in Examples 1 to 4 and Comparative Examples 1 to 3, a tendency that the radial rate of change in resistivity is greater as the rate of change in resistivity along the central axis during crystal growing increases could substantially be confirmed.

According to the measurement results in the Examples described above, it was demonstrated that, with the method of manufacturing silicon single crystal according to the present invention, that is, by setting the boron concentration in the initial silicon melt to 4E14 atoms/cm³ or lower and setting a ratio of phosphorus concentration to boron concentration between 0.42 or higher and 0.50 or lower, p-type silicon single crystal, in which resistivity along the central axis during crystal growth was not lower than 50 Ω·cm, the rate of change in resistivity along the central axis during crystal growth was not higher than 10%, and the rate of change in resistivity in the cross-section perpendicular to the central axis during crystal growth was not higher than 3% at a site where the solidified fraction was not higher than 0.80, could be manufactured.

In addition, it was demonstrated that, by setting the boron concentration in the initial silicon melt to 4E14 atoms/cm³ or lower and setting a ratio of phosphorus concentration to boron concentration 0.42 or higher and 0.47 or lower, p-type silicon single crystal, in which resistivity along the central axis during crystal growing was not lower than 50 Ω·cm, the rate of change in resistivity along the central axis during crystal growing was not higher than 10%, and the rate of change in resistivity in the cross-section perpendicular to the central axis during crystal growing was not higher than 2% at a site where the solidified fraction was not higher than 0.80, could be manufactured.

The method of manufacturing silicon single crystal, the silicon single crystal, and the wafer according to the embodiment of the present invention have been described above, and the present embodiment achieves the following effect.

P-type silicon single crystals, in which resistivity along the central axis during crystal growth was not lower than 50 Ω·cm, the rate of change in resistivity along the central axis during crystal growth was not higher than 10%, and the rate of change in resistivity in the cross-section perpendicular to the central axis during crystal growth was not higher than 3%, can be manufactured by the CZ method, excellent in mass productivity.

The invention claimed is:

1. A method for manufacturing a silicon single crystal, comprising growing a p-type silicon single crystal by the Czochralski method from an initial silicon melt in which boron is present in a concentration not higher than 4E14 atoms/cm³, phosphorus is contained in the initial silicon melt, and the ratio of phosphorus concentration to boron concentration is not lower than 0.42 and not higher than 0.50, and setting the ratio of the rate of cooling of an edge portion of the silicon single crystal to the rate of cooling of a central portion of the silicon single crystal to between 1.4 and 2.0.

2. A p-type silicon single crystal grown by the Czochralski method from an initial silicon melt to which boron and phosphorus were added, having a resistivity along a central crystal growth axis not lower than 50 Ω·cm and a rate of change in resistivity along said central crystal growth axis not higher than 10%, measured in a constant diameter section of the p-type silicon single crystal up to a point where 80% of the single crystal has been solidified from the silicon melt.

3. The p-type silicon single crystal of claim 2, wherein the rate of change of resistivity in a cross-section perpendicular to said central crystal growth axis is not higher than 3%.

4. A wafer obtained by slicing the p-type silicon single crystal of claim 2 perpendicular to the central crystal growth axis.

5. A wafer obtained by slicing the p-type silicon single crystal of claim 3 perpendicular to the central crystal growth axis.

6. A heat treated wafer having an oxide film after heat treatment with a thickness of 2 nm or less, prepared by heat treating a wafer of claim 4 in a non-oxidizing atmosphere at a temperature not lower than 1150° C. and not higher than 1250° C. for a time period not less than 10 minutes and not greater than 2 hours.

7. The wafer according to claim 6, wherein the non-oxidizing atmosphere in the heat treatment is a noble gas atmosphere in which total impurities are 5 ppma or less.

8. A heat treated wafer having an oxide film after heat treatment with a thickness of 2 nm or less, prepared by heat treating a wafer of claim 5 in a non-oxidizing atmosphere at a temperature not lower than 1150° C. and not higher than 1250° C. for a time period not less than 10 minutes and not greater than 2 hours.

9. The wafer according to claim 8, wherein the non-oxidizing atmosphere in the heat treatment is a noble gas atmosphere in which total impurities are 5 ppma or less.

* * * * *